United States Patent [19]

Jacobine

[11] 4,425,208

[45] Jan. 10, 1984

[54] COMPOSITIONS AND PROCESS

[75] Inventor: Anthony F. Jacobine, Meriden, Conn.

[73] Assignee: The Upjohn Company, Kalamazoo, Mich.

[21] Appl. No.: 290,689

[22] Filed: Aug. 6, 1981

[51] Int. Cl.³ .............................. C08F 2/48; C08F 2/50
[52] U.S. Cl. .......................... 204/159.15; 204/159.18; 204/159.19; 204/159.23
[58] Field of Search ...................... 204/159.18, 159.19, 204/159.15, 159.23

[56] References Cited

U.S. PATENT DOCUMENTS

| | | | |
|---|---|---|---|
| 3,923,703 | 12/1975 | Fukutani et al. | 204/159.14 |
| 3,933,885 | 1/1976 | Satomura | 204/159.15 |
| 3,993,549 | 11/1976 | Bush et al. | 204/159.22 |
| 4,088,554 | 5/1978 | Felder et al. | 204/159.15 |
| 4,110,188 | 8/1978 | Darms et al. | 204/159.14 |
| 4,153,525 | 5/1979 | Araki et al. | 204/159.15 |
| 4,222,835 | 9/1980 | Dixon | 204/159.16 |
| 4,348,427 | 9/1982 | Priola et al. | 204/159.16 |

*Primary Examiner*—Allan Lieberman
*Attorney, Agent, or Firm*—Denis A. Firth; John Kekich

[57] ABSTRACT

The photopolymerization of ethylenically unsaturated compounds is effected using a combination of an aromatic ketone photosensitizer and a tetrasubstituted urea (e.g. N,N,N',N'-tetramethylurea) or N,N-disubstituted acid amide. Storage stable liquid photoinitiator compositions comprising an aromatic ketone sensitizer (e.g. benzophenone) and a tetrasubstituted urea (e.g. N,N,N',N'-tetramethylurea) are also disclosed. The use of the tetrasubstituted urea or N,N-disubstituted amide possesses advantages (storage stability, lack of discoloration on curing) over photosensitizers such as Michler's ketone which have been used previously in combination with aromatic ketone photosensitizers.

11 Claims, No Drawings

COMPOSITIONS AND PROCESS

BACKGROUND OF THE INVENTION

1. Field of the Invention

This invention relates to photopolymerization reactions and photoinitiator compositions useful therein and is more particularly concerned with the photopolymerization of ethylenically unsaturated compounds using a combination of an aromatic ketone photosensitizer and a substituted urea or amide and with certain compositions comprising mixtures of said compounds.

2. Description of the Prior Art

The use of aromatic ketones such as benzophenone, acetophenone, dialkoxyacetophenones and the like as photosensitizers in the photopolymerization of ethylenically unsaturated compounds is well-known in the art. It is also known that the use of combinations of such aromatic ketones with other photosensitizers will permit photopolymerization processes to occur at a faster rate than is the case if the individual photosensitizers are used alone. Indeed, some photosensitizers, e.g. benzophenone, will not function when used alone. A combination of photosensitizers which is frequently used is a mixture of at least two aromatic ketones, one of which is benzophenone or acetophenone or the like and the other is Michler's ketone [p,p'-di(dimethylamino)benzophenone]. While this type of combination gives excellent results in terms of rates of photopolymerization, it has a number of disadvantages, the chief of which is that the use of the Michler's ketone frequently gives rise to discoloration in the finished polymer.

We have now found certain combinations of aromatic ketone photosensitizers with tetra-substituted ureas and or N,N-disubstituted amides which give excellent rates of photopolymerization when employed in systems involving the photopolymerization of ethylenic double bonds and which are free from the drawbacks encountered with Michler's ketone and which possess additional advantages which will be discussed in detail below.

The use of amides and urea and urea derivatives in polymerization reactions which are activated by radiation of various kinds has been described in the art. U.S. Pat. No. 3,993,549 describes the addition of finely powdered urea to liquid polyene-polythiol systems which are to be cured by ultraviolet or other types of radiation in the presence of photosensitizers such as aromatic ketones.

U.S. Pat. No. 4,088,554 describes the use of amides of α,β-dioxocarboxylic acids as photoinitiators for the curing of ethylenically unsaturated resins by exposure to ultraviolet light. U.S. Pat. No. 4,153,525 describes the use of a broad class of amides, including N,N-disubstituted amides, for use in the curing of unsaturated polyester resins by exposure to ionizing radiation. U.S. Pat. No. 4,222,835 relates to systems curable by ultraviolet radiation which comprise a polymerizable monomer, thermal initiator, a photoinitiator (which can be an aromatic ketone photosensitizer) and an accelerator which serves to lower the temperature of activation of the thermal initiator. The list of the latter accelerators named in the reference is inclusive of dimethylformamide.

Belgian Pat. No. 884,395 shows the use as comonomers in photopolymerizable systems of tetrasubstituted ureas which contain at least one vinyl substituent attached to a nitrogen atom as well as N-vinyl substituted amides.

So far as I am aware it has not previously been suggested that tetrasubstituted ureas or N,N-disubstituted amides could be used in combination with aromatic ketone sensitizers as photoinitiators or photosensitizers in systems involving photopolymerization of ethylenically unsaturated compounds.

SUMMARY OF THE INVENTION

This invention comprises an improved method for the photopolymerization of ethylenically unsaturated compounds wherein the improvement comprises employing as the photoinitiator a combination of an aromatic ketone photosensitizer and a member selected from the class consisting of (a) tetrasubstituted ureas of the formula:

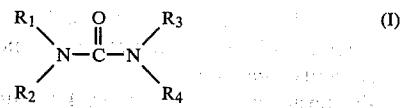

wherein $R_1$, $R_2$, $R_3$ and $R_4$ taken individually represent members each of which is independently selected from the class consisting of lower-alkyl, cycloalkyl, alkenyl from 3 to 8 carbon atoms, aralkyl and aryl, and $R_1$, $R_2$, $R_3$ and $R_4$ taken together with the nitrogen atoms to which they are attached also represent the residues of heterocyclic moieties having from 3 to 8 ring atoms; and (b) N,N-disubstituted amides of the formula:

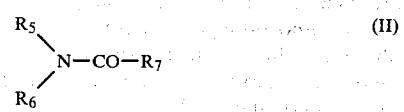

wherein $R_5$ and $R_6$ taken individually represent members both of which are independently selected from the class consisting of lower-alkyl and alkenyl from 3 to 8 carbon atoms, $R_5$ and $R_6$ taken together with the N atom to which they are attached also represent the residue of a heterocyclic moiety having from 3 to 8 ring atoms, and $R_7$ is selected from the class consisting of hydrogen, alkyl and aryl.

The invention also comprises photoinitiator compositions which are liquids and are stable on storage for prolonged periods at ambient temperatures (circa 15° to 20° C. or higher). These compositions are mixtures of certain of the aromatic ketone sensitizers and certain N,N,N',N'-tetra(lower-alkyl) ureas in approximately equal proportions by weight as will be described more fully hereafter.

The term a "photosensitizer" is used herein in its conventionally accepted sense as meaning an agent which serves to render a molecule, such as a polymerizable ethylenically unsaturated monomer, sensitive to the action of light to which said molecule is not normally sensitive.

The term "aromatic ketone photosensitizer" means the well-recognized class of aromatic ketones, i.e. compounds in which a ketonic group is attached directly to a nuclear carbon present in an aromatic ring, which are known to act as photosensitizers. Illustrative of such compounds are benzophenone, acetophenone, valerophenone, p-diacetylbenzene, 3-acetylphenanthrene, 1,3,5-triacetylbenzene, 2-chlorothioxanthen-9-one, xanthen-9-one, fluorenone, 2,2-diethoxyacetophenone, and the like.

The term "lower-alkyl" means alkyl from 1 to 8 carbon atoms, inclusive, such as methyl, ethyl, propyl, butyl, pentyl, hexyl, heptyl, and octyl including isomeric forms thereof.

The term "alkyl" without any specified carbon atom limitation is inclusive of lower-alkyl in addition to nonyl, decyl, dodecyl, tridecyl, tetradecyl, pentadecyl, hexadecyl, heptadecyl, octadecyl and the like including isomeric forms thereof.

The term "alkenyl from 3 to 8 carbon atoms" means a straight or branched chain alkenyl group having the stated number of carbon atoms. Illustrative of such groups are propenyl, butenyl, pentenyl, hexenyl, heptenyl and octenyl including isomeric forms thereof.

The term "cycloalkyl" is inclusive of cyclopentyl, cyclohexyl, 2-methylcyclohexyl, 2,4-dimethylcyclohexyl, cycloheptyl, 2-methylcycloheptyl, 4-methylcycloheptyl and the like.

The term "aralkyl" means aralkyl having from 7 to 13 carbon atoms such as benzyl, phenethyl, 3-phenylpropyl, benzyhydryl, 1-naphthylmethyl and the like.

The term "aryl" means the radical obtained by removing a hydrogen atom attached to a nuclear carbon atom of an aromatic hydrocarbon having from 6 to 12 carbon atoms. Illustrative of aryl are phenyl, tolyl, xylyl, naphthyl, diphenylyl and the like.

Illustrative of the heterocyclic residues having from 3 to 8 ring atoms which can be formed by the radicals $R_1$, $R_2$, $R_3$, $R_4$, $R_5$ and $R_6$ and the N atoms to which they are attached are morpholino, alkyl-morpholino such as 2-methylmorpholino, 3-methylmorpholino, piperidino, alkylpiperidino such as 2-methylpiperidino, 3-methylpiperidino, hexamethyleneimino, aziridino, azetidino, pyrrolidino, and the like.

DETAILED DESCRIPTION OF THE INVENTION

The photopolymerization process of the invention is carried out in accordance with procedures conventional in the art, the distinguishing feature being the use as photoinitiator of a combination of an aromatic ketone photosensitizer and a compound of formula (I) or (II). Photopolymerization processes have achieved considerable importance industrially particularly in situations in which thin layers have to be cured in a short time. Typical of such situations are the curing of lacquer coatings, the drying of printing inks, the curing of printing plates fabricated from photo-curable systems, and the like.

The systems which are employed in photopolymerization processes comprise one or more polymerizable ethylenically unsaturated monomers or unsaturated oligomers and polymers, and a photoinitiator. They may also contain a variety of additives including thermal inhibitors such as hydroquinone which prevent premature polymerization during production and handling of the system, antioxidants, fillers, pigments, thickeners and the like.

The systems are applied as coatings or thin films to an appropriate substrate and the photopolymerization is carried out by exposing the film or coating to radiation with light which is rich in short-wave radiation. Illustrative of appropriate light sources are medium-pressure, high pressure and low pressure mercury vapour lamps and fluorescent light sources which have emission maxima in the range between about 300 and 400μ.

Illustrative of unsaturated monomers are esters of acrylic and methacrylic acids with monohydric and polyhydric alcohols, examples of such esters being methyl, ethyl, propyl, hexyl and isoöctyl acrylates and methacrylates, neopentyl diacrylate, trimethylolpropane triacrylate, glycerol triacrylate and the like; acrylonitrile, methacrylonitrile, acrylamide and methacrylamide; vinyl esters such as vinyl acetate, vinyl propionate, vinyl acrylate and the like; styrene, divinylbenzene, vinyl chloride, N-vinylpyrrolidone, dialkyl phthalate, dialkyl maleate and ethylene glycol dialkyl ether. Illustrative of photopolymerizable oligomers or polymers which can be employed in the photopolymerizable systems are thermoplastic resins containing ethylenically unsaturated groups such as unsaturated polyesters derived from fumaric, maleic, citraconic, and the like ethylenically unsaturated dicarboxylic acids, acrylic resins, isocyanate-modified or epoxy-modified resins and the like. A detailed description and exemplification of the ethylenically unsaturated monomers and polymers which are employed in photopolymerizable systems is given in the aforesaid U.S. Pat. No. 4,088,554 whose disclosure is incorporated herein by reference.

The monomers, oligomers and polymers employed in the photopolymerizable systems are generally liquids at ambient temperatures (circa 20° C.), or are readily soluble in solvents commonly employed in coating compositions, and are therefore easily applied to substrates as coatings. The aromatic ketones which are employed in accordance with the invention are for the most part readily miscible with or soluble in the other components of the photopolymerizable systems. Many of the compounds (I) and (II) which are employed in combination with the aromatic ketone sensitizers in accordance with the invention are liquids at ambient temperature and readily miscible with the other systems components. Those which are not liquid are found to dissolve readily in the aromatic ketone sensitizers and or the other components of the photopolymerizable systems. As will be discussed more fully below, certain of the aromatic ketone sensitizers and the compounds (I) and (II) can be admixed to form compositions which remain liquid and show no signs of deterioration upon prolonged storage.

In carrying out the photopolymerizable process of the invention the various components of the system can be brought together in any order and using any conventional type of mechanical or manual blending equipment. The aromatic ketone photosensitizer and the compound (I) or (II), or more than one of the latter compounds if desired, can be added as separate components to the system or can be preblended and added as a single component. The latter method is sometimes preferred since in many instances all the components of the system other than the photoinitiator composition may be prepared and stored prior to use and the photoinitiator combination is only added to the system immediately prior to use thereby avoiding any possible instability problems which might arise if all the necessary components of the system were mixed and then stored for extended periods before use.

The proportion in which the combination of photosensitizers of the invention is employed in the photopolymerizable systems can vary over a wide range depending upon the nature of the system in which the combination is to be used and the desired speed of curing. The appropriate proportion to be used in any given instance can be readily determined by a process of trial and error. In general the combination of photosensitizers is employed in an amount within the range of about 5.5 to about 11 parts by weight per 100 parts of polymerizable monomer and polymer (if present).

Similarly, the proportion within which the individual components are employed within the photosensitizer combination of the invention can be varied over a wide range. In general the amount of the compound (I) or (II), or the total amount of compounds (I) and or (II) if more than one such compound is employed in the combination, is within the range of about 20 parts to about 200 parts by weight per 100 parts by weight of the aromatic ketone photosensitizer. Preferably the amount of compound (I) and or (II) is within the range of about 50 parts to about 100 parts by weight per 100 parts by weight of the aromatic ketone photosensitizer.

The compounds of formula (I) and (II) are, for the most part, known in the art and can be prepared by methods well-known in the art for the preparation of such compounds; see, for example, W. Mischler and C. Escherich, *Ber.*, 12, 1162 (1879); A. Luttringhaus and H. W. Dirksen, *Angew. Chem. Internat. Ed.*, 3, 260 (1964).

Illustrative of compounds of the formula (I) are N,N,N',N'-tetramethyl-, N,N,N',N'-tetraethyl-, N,N,N',N'-tetraisopropyl-, N,N-dimethyl-N',N'-diethyl-, N,N,N',N'-tetrabutyl, N,N,N',N'-tetrahexyl-, N,N,N',N'-tetra(2-ethylhexyl)-, N,N,N',N'-tetracyclohexyl-, N,N,N',N'-tetra-allyl-, N,N'-dimethyl-N,N'-diphenyl-, N,N,N',N'-tetrabenzyl-, N,N,N',N'-tetrabutenyl-, N,N,N',N'-tetrahexenyl-, and N,N,N',N'-tetraoctenylurea, carbonyldimorpholide

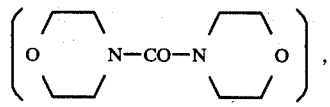

and N,N'-dimethylimidazolin-2-one. Illustrative of compounds of the formula (II) are N,N-dimethylformamide, N,N-dimethylacetamide, N,N-diethylformamide, N,N-dihexylformamide, N,N-diethylbenzamide, N,N-diisoctylbenzamide, N-methyl-, N-ethyl-, N-isobutyl- and N-hexyl-pyrrolidinone.

While any of the compounds of formulae (I) and (II) can be used, alone or in combination of two or more, in the photoinitiator combination of the invention, it is preferred to use a tetra(lower-alkyl)urea, i.e. formula (I) wherein $R_1$, $R_2$, $R_3$ and $R_4$ each represent lower-alkyl, or an N-(lower-alkyl)pyrrolidinone. Particularly preferred compounds for use in the photoinitiator combination of the invention are tetramethylurea and N-methyl-pyrrolidinone.

As mentioned previously a particular embodiment of the invention comprises certain compositions which are mixtures of an aromatic ketone photosensitizer and certain of the compounds of formulae (I) and (II). Thus, I have found that compositions which remain liquid on storage at temperatures as low as about 3° C. and which show no sign of deterioration, in terms of their performance as photoinitiators, upon storage for extended periods (usually but not necessarily in the absence of light) are obtained by admixture of a liquid aromatic ketone photosensitizer and (i) a compound of formula (I) in which each of $R_1$, $R_2$, $R_3$ and $R_4$ independently is methyl or ethyl and or (ii) a compound of formula (II) in which $R_5$ and $R_6$ are independently methyl or ethyl and $R_7$ is hydrogen or lower-alkyl. The proportion of the various components in these compositions can vary over a wide range according to the particular components in any given combination. In general the proportions are within the range of about 20 to about 80 parts by weight of compound (I) or (II) per 100 parts by weight of the total composition, the remainder of the composition being the aromatic ketone photosensitizer. A particularly preferred composition comprises a mixture of benzophenone and tetramethylurea in the proportion of about 30 parts to about 60 parts by weight of the latter per 100 parts by weight of composition, the remainder being benzophenone. These compositions are found to remain liquid at temperatures as low as about 3° C.

The use of the photoinitiator compositions of the invention gives excellent results in terms of the rapidity with which cure of the photopolymerizable systems can be effected and in the clarity and excellence of physical properties of the cured system when applied as a coating. The use of these compositions represents a marked improvement in clarity and lack of discoloration of the cured films as compared with systems commonly employed in which Michler's ketone is normally present as part of the photoinitiator. In addition, the liquid nature and storage stability of photoinitiator compositions of the invention, if preblended prior to use, represents a marked advantage in ease of handling and use. In addition it has been found that the photoinitiator combinations of the invention can be stored for substantial periods (1 month or longer) in admixture with the other components of the photopolymerizable systems without showing any signs of instability or being changed in any way in terms of their ability to cure the system on exposure to appropriate radiation.

The following examples describe the manner and process of making and using the invention and set forth the best mode contemplated by the inventor of carrying out the invention but are not to be construed as limiting.

EXAMPLE 1

An ultraviolet curable coating composition was prepared using a photopolymerizable system obtained by admixing 60 parts by weight of a urethane resin containing >1 percent free isocyanate groups (Chempol 19-4827: Freeman Chemical), 20 parts by weight of 1,6-hexanediol diacrylate, 7.5 parts by weight of N-vinylpyrrolidone, and 7.5 parts by weight of 2-hydroxyethyl acrylate. To the mixture so obtained was added a liquid mixture of 3 parts by weight of benzophenone and 2 parts by weight of N,N,N',N'-tetramethylurea. A layer of the resulting composition was then applied to the surface of a series of Parker steel test plates (4"×6"×24 gauge) and the thickness of each layer was adjusted to 2 mils. using a Gardner Knife Edge. The coated surface of each plate was then exposed to radiation from a single 200W ultraviolet light source using a PPG Model QC 1202 UV Processor. The speed of the transporting belt of the instrument was varied from plate to plate until the fastest speed was determined at which a plate could be processed and show complete cure as evidenced by hardness determined by fingernail test.

It was found that, using the above test conditions the fastest belt speed which gave complete cure was 100 feet per minute. When the above test was repeated using exactly the same composition, with the sole exception that the tetramethylurea was replaced by an equal amount by weight of Michler's ketone, the rate of cure was found to be significantly less.

The coating prepared and cured using the combination of benzophenone and tetramethylurea was found to be clear and colorless whereas the coating prepared using Michler's ketone in the photosensitizer was yellow.

EXAMPLE 2

An ultraviolet curable coating composition was prepared using a photopolymerizable system obtained by admixing 50 parts by weight of an epoxy resin [DRH 303: Shell Chemical Company], 25 parts by weight of 2-ethylhexyl acrylate, 10 parts by weight of 2-hydroxyethyl acrylate, and 10 parts by weight of trimethylolpropane triacrylate. To the resulting mixture was added a liquid mixture of 3 parts by weight of benzophenone and 2 parts by weight of N,N,N',N'-tetramethylurea.

Using the procedure described in Example 1 the fastest speed at which a 2 mil. thick layer of the coating composition on a Parker steel test plate could be cured was found to be 100 feet per minute.

The experiment was repeated exactly as described with the sole exception that the 2 parts by weight of tetramethylurea was replaced by an equal amount by weight of Michler's ketone. The fastest curing speed for this composition was found to be the same, namely 100 feet per minute.

EXAMPLE 3

A series of coating compositions was prepared using a photopolymerizable system as described in Example 1. To six different portions of this system each being 90 parts by weight, there was added 10 parts by weight of a mixture of benzophenone and tetramethylurea which mixture varied in proportion from test sample to test sample as shown in Table 1 (proportions in parts by weight). The fastest curing speed for each test sample, when tested as a 2 mil. thickness coating using the procedure and apparatus described in Example 1, was determined and is also shown in Table 1.

TABLE 1

| | Photoinitiator | | Cure Speed |
| --- | --- | --- | --- |
| | Benzophenone | Tetramethylurea | (feet per minute) |
| (a) | 4 | 1 | 40–50 |
| (b) | 3.5 | 1.5 | 50–67 |
| (c) | 3 | 2 | 50–67 |
| (d) | 2.5 | 2.5 | 50 |
| (e) | 2 | 3 | 50 |
| (f) | 1.5 | 3.5 | 40 |

Each of the mixtures of benzophenone and tetramethylurea shown in the above Table as (a) through (f) was a clear liquid at ambient temperatures (circa 20° C.). Compositions (c), (d) and (e) could be maintained for prolonged periods at temperatures as low as 10° C. without showing any tendency to solidify. The freezing point of composition (d) was found to be −3° C. and that of composition (c) was 3° C.

EXAMPLE 4

A series of coating compositions was prepared using the acrylated urethane photopolymerizable system described in Example 1 and the epoxyacrylate photopolymerizable system described in Example 2 using a photosensitizer comprising a mixture of 60 percent by weight of benzophenone and 40 percent by weight of a compound as shown in Table 2 below. In all cases 90 parts by weight of the photopolymerizable system was admixed with 10 parts by weight of the photosensitizer composition and the resulting mixture was used to prepare a coating as described in Example 1. The fastest curing speed for each composition, when tested as a 2 mil. thickness coating using the procedure and apparatus described in Example 1, was determined and is also shown in Table 2.

TABLE 2

| | Cure speed (feet per minute) | |
| --- | --- | --- |
| Compound | Acrylated urethane | Epoxy acrylate |
| Tetraethylurea | 50 | 50 |
| Tetraisopropylurea | 40 | 25 |
| Tetracyclohexylurea | 50 | 25 |
| Tetrabenzylurea | 68 | 33 |
| Tetraallylurea | 50 | 33 |
| Carbonyldimorpholide | 68 | 34 |
| N,N'—dimethyl-N,N'—diphenylurea | 50 | 25 |
| N,N—diethylbenzamide | 50 | — |
| N—methylpyrrolidinone | 68 | 40 |
| N,N—dimethylacetamide | 50 | 25 |

EXAMPLE 5

A photoinitiator composition in accordance with the invention was prepared by admixing 2-chlorothioxanthone and tetramethylurea in the proportions of 2 parts of the former to each part of the latter. The resulting mixture was then used to cure films prepared from the acrylated urethane photopolymerizable system described in Example 1 and the epoxyacrylate photopolymerizable system described in Example 2. In both cases 2 parts by weight of the photoinitiator system was admixed with 98 parts of the photopolymerizable system and coatings were prepared from the resulting mixture and cured using the procedure and apparatus described in Example 1. The fastest curing speed measured for each system was as follows:

Acrylated urethane system: 15 feet per minute
Epoxyacrylate system: 25 feet per minute For purposes of comparison the above experiments were repeated exactly as described except that the tetramethylurea was replaced by an equal amount by weight of Michler's ketone. The fastest curing speeds for each system were as follows:

Acrylated urethane system: 12.5 feet per minute
Epoxyacrylate system: 40 feet per minute

I claim:

1. In a method for the photopolymerization of ethylenically unsaturated compounds selected from the group consisting of polymerizable ethylenically unsaturated monomers, oligomers and polymers, the improvement which comprises employing as the photoinitiator a combination of an aromatic ketone sensitizer and from 20 to 200 parts by weight, per 100 parts by weight of said aromatic ketone sensitizer, of a tetra-substituted urea of the formula:

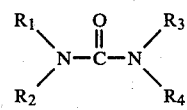

wherein $R_1$, $R_2$, $R_3$ and $R_4$ taken individually represent members each of which is independently selected from the class consisting of lower-alkyl, cycloalkyl, aralkyl and aryl and $R_1$, $R_2$, $R_3$, and $R_4$ taken together with the N atoms to which they are attached also represent the residue of a heterocyclic moiety having from 2 to 8 ring atoms.

2. A method according to claim 1 wherein the aromatic ketone is benzophenone.

3. A method according to claim 1 or 2 wherein the member employed in combination with the aromatic ketone is a tetra(lower-alkyl)urea.

4. A method according to claim 1 or 2 wherein the member employed in combination with the aromatic ketone is tetramethylurea.

5. A method according to claim 1 wherein the proportion of aromatic ketone employed in the photoinitiator combination is from about 20 to about 80 percent by weight of the remainder of said combination being the tetra-substituted urea.

6. In a method for the photopolymerization of ethylenically unsaturated compounds selected from the group consisting of polymerizable ethylenically unsaturated monomers, oligomers and polymers the improvement which comprises employing as the photoinitiator a combination of benzophenone and a tetra(lower-alkyl)urea.

7. A method according to claim 6 wherein the tetra(lower-alkyl)urea is tetramethylurea.

8. A method according to claim 6 wherein the tetra(lower-alkyl)urea is tetraethylurea.

9. A method according to claim 6 wherein the tetra(lower-alkyl)urea is tetra(isopropyl)urea.

10. In a method for the photopolymerization of ethylenically unsaturated compounds selected from the group consisting of polymerizable ethylenically unsaturated monomers, oligomers and polymers the improvement which comprises employing as the photoinitiator a combination of 2-chlorothioxanthone and a tetra(lower-alkyl)urea.

11. A method according to claim 10 wherein the tetra(lower-alkyl)urea is tetramethylurea.

* * * * *

UNITED STATES PATENT OFFICE
CERTIFICATE OF CORRECTION

Patent No. 4,425,208　　　　　　　　　Dated January 10, 1984

Inventor(s) Anthony F. Jacobine

It is certified that error appears in the above-identified patent and that said Letters Patent are hereby corrected as shown below:

Column 9, Claim 5, line 16 "weight of the" should read --weight the--.

Signed and Sealed this

Fourteenth Day of August 1984

[SEAL]

Attest:

GERALD J. MOSSINGHOFF

Attesting Officer

Commissioner of Patents and Trademarks